(12) United States Patent
Furuie

(10) Patent No.: US 11,943,971 B2
(45) Date of Patent: Mar. 26, 2024

(54) OLED WITH ONE COLOR EMITTING LAYER ON A CONVEX PORTION

(71) Applicant: Japan Display Inc., Tokyo (JP)

(72) Inventor: Masamitsu Furuie, Tokyo (JP)

(73) Assignee: Japan Display Inc., Tokyo (JP)

( * ) Notice: Subject to any disclaimer, the term of this patent is extended or adjusted under 35 U.S.C. 154(b) by 294 days.

(21) Appl. No.: 17/246,764

(22) Filed: May 3, 2021

(65) Prior Publication Data

US 2021/0257423 A1 Aug. 19, 2021

Related U.S. Application Data

(63) Continuation of application No. PCT/JP2019/037575, filed on Sep. 25, 2019.

(30) Foreign Application Priority Data

Nov. 12, 2018 (JP) ................................. 2018-212367

(51) Int. Cl.
*H01L 27/32* (2006.01)
*H01L 51/00* (2006.01)
(Continued)

(52) U.S. Cl.
CPC ......... *H10K 59/122* (2023.02); *H10K 59/352* (2023.02); *H10K 71/00* (2023.02); *H10K 71/166* (2023.02)

(58) Field of Classification Search
CPC .................................................. H10K 59/122
See application file for complete search history.

(56) References Cited

U.S. PATENT DOCUMENTS

2001/0036691 A1  11/2001  Kitazume et al.
2003/0189400 A1  10/2003  Nishio et al.
(Continued)

FOREIGN PATENT DOCUMENTS

CN  110048005 A  *  7/2019  ......... H01L 27/3246
JP  2001-313169 A     11/2001
(Continued)

OTHER PUBLICATIONS

International Search Report dated Nov. 26, 2019 for the PCT Application No. PCT/JP2019/037575, with English translation.
(Continued)

*Primary Examiner* — Peter Bradford
(74) *Attorney, Agent, or Firm* — Michael Best & Friedrich LLP

(57) ABSTRACT

In a display device in which an OLED is formed by a separate coating method, improving the accuracy of vapor deposition position and reducing display defects are established. In the array substrate, a display unit that displays an image configured with a plurality of pixels is formed. A first convex portion and a second convex portion are provided on a surface of a boundary region between the pixels of the array substrate. A first organic layer including a layer exhibiting a first emission color is stacked on the pixel electrode of the pixel, and second organic layers including a layer exhibiting a second emission color are stacked on the pixel electrode of the pixels. The first organic layer is provided to cover only the first convex portion. The second organic layers are provided not to cover any one of the first convex portion and the second convex portion.

5 Claims, 19 Drawing Sheets

(51) Int. Cl.
*H01L 51/56* (2006.01)
*H10K 59/122* (2023.01)
*H10K 59/35* (2023.01)
*H10K 71/00* (2023.01)
*H10K 71/16* (2023.01)

(56) References Cited

U.S. PATENT DOCUMENTS

| | | | |
|---|---|---|---|
| 2007/0015430 A1 | 1/2007 | Nishio et al. | |
| 2011/0018008 A1* | 1/2011 | Lee | H10K 50/8428 257/E33.059 |
| 2014/0027729 A1* | 1/2014 | So | H10K 50/16 438/34 |
| 2018/0190731 A1* | 7/2018 | Park | G09G 3/3225 |

FOREIGN PATENT DOCUMENTS

| | | | |
|---|---|---|---|
| JP | 2003-257650 A | | 9/2003 |
| JP | 2009-272277 A | | 11/2009 |
| JP | 2013-089475 A | | 5/2013 |
| JP | 2013089475 A | * | 5/2013 |
| KR | 20200076278 A | * | 6/2020 |

OTHER PUBLICATIONS

Korean Office Action dated Feb. 28, 2023 for the corresponding Korean Patent Application No. 10-2021-7013866, with English translation.

Office Action dated Sep. 13, 2022, for corresponding JP Patent Application No. 2018-212367, with Machine English translation.

Chinese Office Action dated Nov. 30, 2023, for the corresponding Chinese Patent Application No. 201980074446.X, with English machine translation.

* cited by examiner

OLED WITH ONE COLOR EMITTING LAYER ON A CONVEX PORTION

CROSS-REFERENCE TO RELATED APPLICATION

The present application is Bypass Continuation of International Application No. PCT/JP2019/037575, filed on Sep. 25, 2019, which claims priority from Japanese Application No. JP2018-212367 filed on Nov. 12, 2018. The contents of these applications are hereby incorporated by reference into this application.

BACKGROUND OF THE INVENTION

1. Field of the Invention

The present invention relates to a display device and a method for manufacturing the same.

2. Description of the Related Art

In recent years, an organic EL display device, which is a display device using an organic electroluminescence (EL) element, has been put to practical use. The organic EL element is generally called an organic light emitting diode (OLED), and the organic EL display device displays a color image by using light emitted by the OLED to generate a plurality of colors such as red (R), green (G), and blue (B). Each of pixels two-dimensionally arranged in an image display region is configured with a plurality of types of sub-pixels that emit light of different colors. Emission intensities of the sub-pixels can be controlled independently, and the pixel can express various colors according to the balance of the emission intensities.

As one of structures for generating a plurality of colors, there is a configuration in which a plurality of types of OLEDs having different emission colors such as RGB are arranged in an image display region. In such configuration, materials of light emitting layers of the OLED are separately coated corresponding to the colors of the sub-pixels, so that the emission colors of the OLED are allowed to be different. Therefore, the configuration is called an RGB separate coating method or the like. In the RGB separate coating method, a vapor deposition mask is disposed on the substrate as a shadow mask, and a light emitting layer is vapor-deposited on an opening thereof (refer to JP 2003-257650 A and JP 2001-313169 A).

In some cases, foreign matter may adhere to the vapor deposition mask, and when the vapor deposition mask is disposed on the substrate, the foreign matter destroys a film of the light emitting layer already vapor-deposited on the substrate, by which pixel defects are caused, and as a result, there is a problem that display defects may occur. As one of the countermeasures, a spacer for securing the distance between the substrate and the vapor deposition mask is disposed, but when the distance between the substrate and the vapor deposition mask is increased, the side effect that the vapor deposition position accuracy deteriorates also occurs.

SUMMARY OF THE INVENTION

An object of the present invention is to resolve the above-described problem and to establish improving a vapor deposition position accuracy and reducing a possibility of occurrence of display defects in a display device in which an OLED is manufactured by a separate coating method.

DETAILED DESCRIPTION OF THE INVENTION

Figure 1:
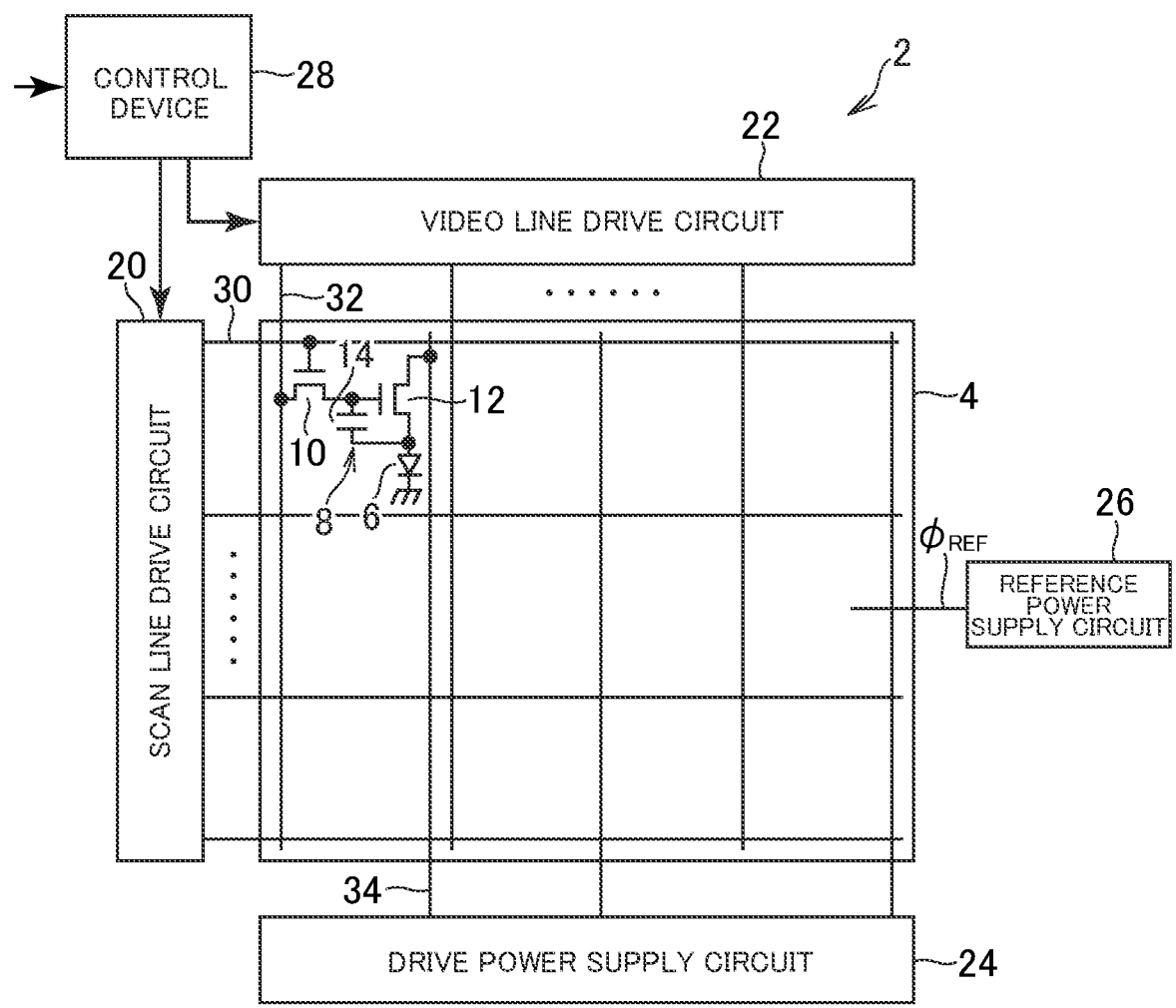
FIG. 1 is a schematic view illustrating a schematic configuration of an organic EL display device according to a first embodiment of the present invention.

Hereinafter, embodiments of the present invention will be described with reference to the drawings. However, the present invention can be implemented in various aspects without departing from the spirit thereof and is not imitatively interpreted to the description contents of the embodiments illustrated below.

In order to further clarify the description, in some cases, the drawings may schematically illustrate width, thickness, shape, and the like of each component as compared with actual appearance, but these are merely examples, and thus, the present invention is not imitatively interpreted. In the present specification and each figure, elements having the same functions as those described with respect to the above-mentioned figure may be denoted by the same reference numerals, and duplicate description thereof may be omitted.

In the detailed description of the present invention, when defining the relative position between a certain component and another component, "above" and "below" include, unless otherwise specified, not only a case where another component is located directly above or directly below a certain component but also a case where another component is further interposed.

The embodiment described below is an organic EL display device. The organic EL display device is an active matrix type display device and is implemented on a television set, a personal computer (PC), a mobile terminal, a mobile phone, or the like.

In an image display region of the display device, a plurality of pixels constituting an image are two-dimensionally arranged. In the following description, an xyz coordinate system, which is a three-dimensional Cartesian coordinate system, is used, and an x-axis and a y-axis are set to correspond to the two-dimensional Cartesian coordinate system corresponding to the image. For example, the x-axis is set to a horizontal direction of the image, and the y-axis is set to a vertical method of the image. The z-axis is set to a thickness direction of an array substrate described later.

In the following embodiment, a display device capable of displaying a color image in which a plurality of types of pixels (sub-pixels) having different emission colors are arranged in the image display region will be described. For example, the emission colors are assumed to be three colors of RGB. It is noted that, although a pixel in a color image corresponds to a set of sub-pixel groups configured with a plurality of types of sub-pixels in a display device, in the display device, the sub-pixel is a configurational unit, and an OLED or a pixel circuit is formed for each sub-pixel. Therefore, in the following description, sub-pixels are basically treated as pixels.

First Embodiment

FIG. 1 is a schematic view illustrating a schematic configuration of an organic EL display device 2 according to an embodiment. The organic EL display device 2 includes a pixel array unit 4 which is a display unit for displaying an image and a drive unit which drives the pixel array unit. In the organic EL display device 2, a stacked structure of a thin film transistor (TFT) and an OLED and the like are formed on a base material made of a glass substrate or a flexible resin film.

An OLED 6 and a pixel circuit 8 are disposed corresponding to the pixels in a matrix shape in the pixel array unit 4. The pixel circuit 8 is configured with a plurality of TFTs, capacitors, and the like. It is noted that the pixel circuit 8 in FIG. 1 illustrates a simplified configuration including TFTs 10 and 12 and a capacitor 14.

On the other hand, the drive unit includes a scan line drive circuit 20, a video line drive circuit 22, a drive power supply circuit 24, a reference power supply circuit 26 and a control device 28 and functions such as driving the pixel circuit 8 and controlling light emission of the OLED 6.

The scan line drive circuit 20 is connected to scan signal lines 30 provided for each horizontal alignment (pixel row) of the pixels. The scan line drive circuit 20 sequentially selects the scan signal lines 30 according to a timing signal input from the control device 28 and applies a voltage for turning on the switching TFT 10 to the selected scan signal lines 30.

The video line drive circuit 22 is connected to video signal lines 32 provided for each vertical alignment (pixel column) of the pixels. The video line drive circuit 22 is input with a video signal from the control device 28, and a voltage according to the video signal of the selected pixel row is output to each video signal line 32 according to the selection of the scan signal lines 30 by the scan line drive circuit 20. The voltage is written to the capacitor 14 through the switching TFT 10 in the selected pixel row. The drive TFT 12 supplies a current to the OLED 6 corresponding to the written voltage, so that the OLED 6 of the pixel corresponding to the selected scan signal line 30 emits light.

The drive power supply circuit 24 is connected to the drive power supply lines 34 provided for each pixel column and supplies a current to the OLED 6 through the drive power supply line 34 and through the drive TFT 12 of the selected pixel row.

The reference power supply circuit 26 applies a constant electric potential $\phi_{REF}$ to a common electrode (not illustrated) constituting the cathode electrode of the OLED 6.

In the embodiment, a lower electrode of the OLED 6 is a pixel electrode formed for each pixel, and an upper electrode of the OLED 6 is a common electrode that is commonly disposed to cover the plurality of pixel electrodes. The lower electrode is connected to the drive TFT 12. On the other hand, the upper electrode is configured with an electrode common to the OLEDs 6 of the entire pixels. In the embodiment, the lower electrode is a positive electrode (anode) of the OLED 6, and the upper electrode is a negative electrode (cathode).

Figure 2:
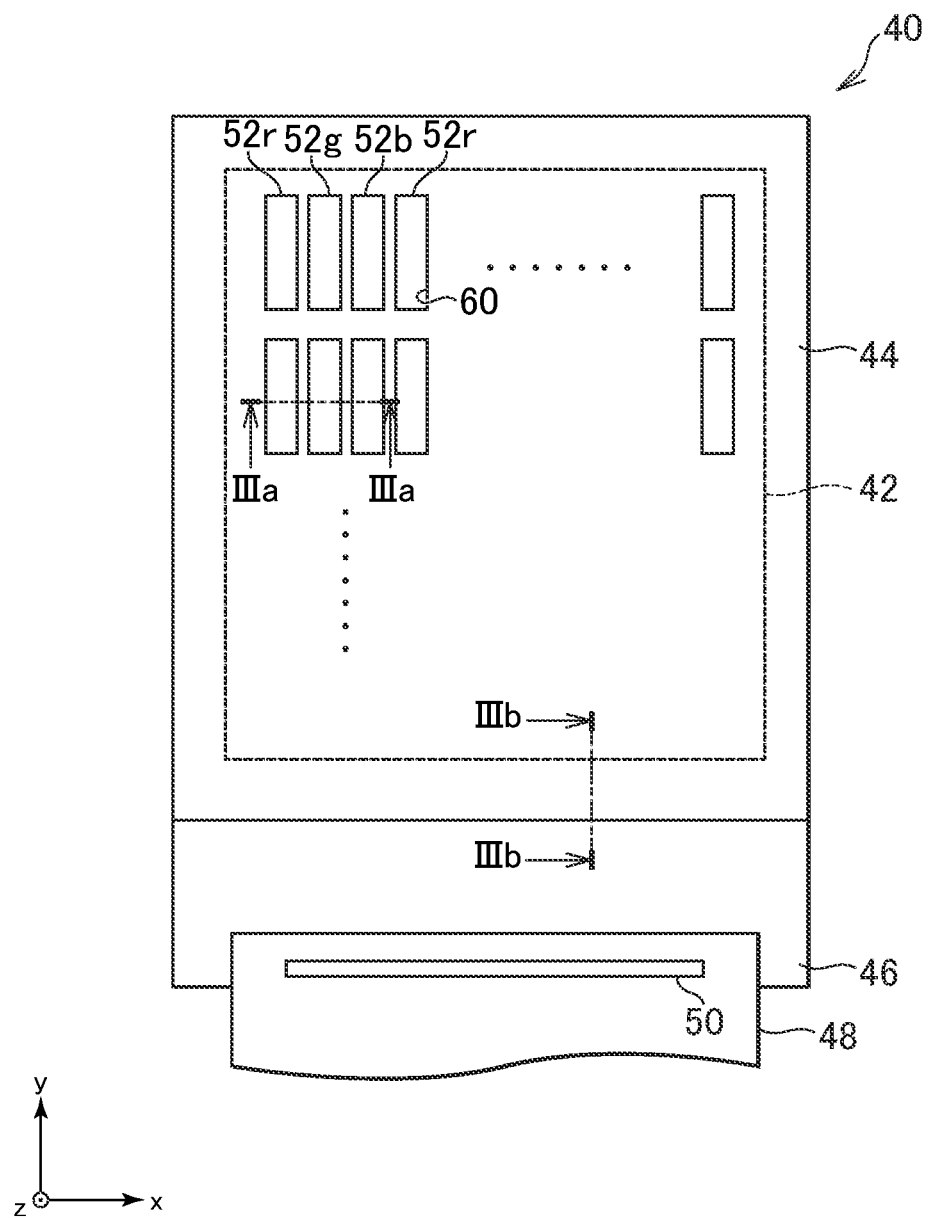
FIG. 2 is a schematic plan view of a display panel of the organic EL display device according to the first embodiment of the present invention.

FIG. 2 is a schematic plan view of a display panel 40 of the organic EL display device 2. The display panel 40 has a rectangular shape and has, for example, a structure in which an array substrate 41 and a counter substrate are bonded together with a filling material interposed therebetween. The array substrate 41 includes a display region 42, a frame region 44, and a connection terminal region 46. The pixel array unit 4 illustrated in FIG. 1 is provided in the display region 42, and as described above, the OLED 6, the pixel circuit 8, and the like are formed in the pixel array unit 4. On the other hand, a polarizing plate or a touch panel can be provided on the counter substrate.

The frame region 44 is the outer edge region of the display region 42, the inner boundary coincides with the outline of the display region 42, the outer boundary is a rectangle, three sides overlap the sides of the display panel 40, and the remaining one side is a boundary with the connection terminal region 46. However, since the end of the display region 42 is defined as the end of the light emitting region of the OLED 6 belonging to the outermost pixels, in some cases, the pixel circuit 8 is provided to straddle the boundary between the display region 42 and the frame region 44.

The connection terminal region 46 is provided adjacent to the frame region 44. The connection terminal region 46 is a rectangle which has three sides overlapping the sides of the display panel 40 and the remaining one side being a boundary with the frame region 44. Wirings for inputting/outputting an electric signal necessary for the operation of the pixel array unit 4 formed in the display region 42 are drawn out from the display region 42 and the frame region 44 to the connection terminal region 46. That is, a group of wirings drawn out from the display region 42 and the frame region 44 are disposed in the connection terminal region 46. A connection terminal for connecting the group of wiring to an external circuit is disposed in the connection terminal region 46. A plurality of connection terminals are arranged, and one of the connection terminals is connected to one of the group of wirings drawn out from the display region 42 and the frame region 44. For example, an FPC 48 is connected to the connection terminal, and the FPC 48 is connected to the control device 28 or other circuits 20, 22, 24, 26, and the like, or an IC 50 is mounted on the FPC 48.

The display panel 40 of the embodiment displays a color image, and the pixels in the color image are configured with, for example, pixels (sub-pixels) that emit light corresponding to any one of the three colors of RGB.

In the embodiment, an example in which R pixels 52r, G pixels 52g, and B pixels 52b are formed in a stripe arrangement in the display region will be described. In such arrangement, pixels of the same type (color) are aligned in the y direction of the image, and RGB is periodically aligned in the x direction. It is noted that, in FIG. 2, each of the R pixel 52r, the G pixel 52g, and the B pixel 52b schematically illustrates an effective light emitting region, which structurally corresponds to the pixel aperture 60, and a region between the above-mentioned regions corresponds to a bank 84 described later.

Figure 3:
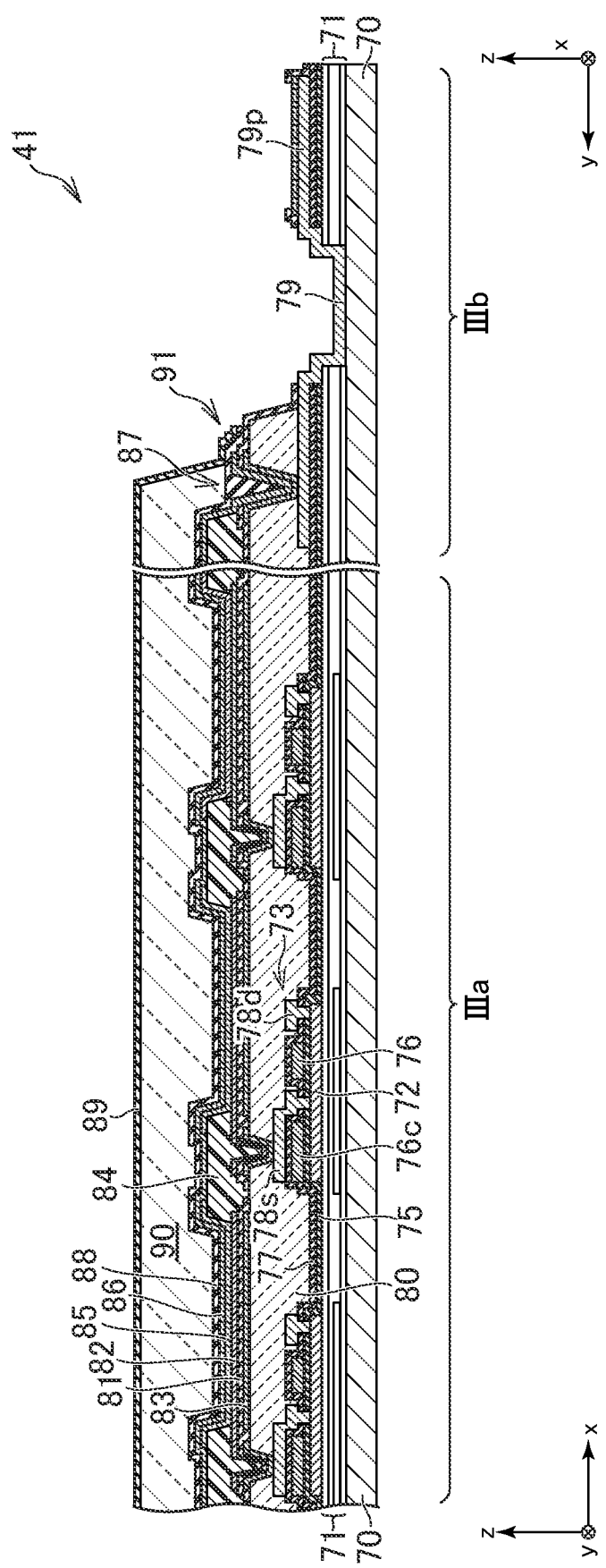
FIG. 3 is a schematic vertical cross-sectional view of an array substrate at positions taken along line IIIa-IIIa and line IIIb-IIIb illustrated in FIG. 2.

FIG. 3 is a schematic vertical cross-sectional view of the array substrate 41, and a cross section IIIa is a cross section in the display region 42 at a position taken along the line IIIa-IIIa illustrated in FIG. 2. A cross section IIIb is a cross section taken along the line IIIb-IIIb illustrated in FIG. 2 and is a cross section of the connection terminal region 46 and the frame region 44 adjacent thereto. The substrate 70 is made of a flexible film of polyimide, polyethylene terephthalate, or the like. The substrate 70 may also be made of other resin or glass. An undercoat layer 71 that serves as a barrier against impurities contained in the substrate 70 is formed on the surface of the substrate 70. The undercoat layer 71 is made of a silicon oxide film, a silicon nitride film, or the like, and may have a stacked structure thereof.

A semiconductor layer 72 is stacked on the undercoat layer 71, and by the semiconductor layer 72, a channel region, a source region, and a drain region of a TFT 73 of a pixel circuit or the like are formed. After the formation of the semiconductor layer 72, a gate insulating film 75 is made of silicon oxide or the like, and a metal film stacked on the gate insulating film 75 is patterned to form a TFT gate electrode 76 or the like.

An inorganic film 77 as an interlayer insulating film is stacked to cover the gate electrode 76 and the like. A metal film is formed on the inorganic film 77, and the source/drain (S/D) electrodes 78s and 78d of the TFT are formed by using the metal film. The S/D electrodes 78s and 78d are electrically connected to the semiconductor layer 72 of the TFT through contact holes penetrating the gate insulating film 75 and the inorganic film 77. Herein, the region of the semiconductor layer 72 which includes the connection portion with the S/D electrode 78s and is injected with impurities that provide conductivity is used as the source region, and the region which includes the connection portion with the S/D electrode 78d and is injected with impurities that provide conductivity is used as the drain region.

The metal film is a conductive film stacked between the OLED and the substrate 70, and a lower layer wiring located below the OLED can be formed by using the metal film. In particular, by the lower layer wiring, a wiring 79 of the connection terminal region 46 and a connection terminal 79p thereof are formed.

A flattening film 80 made of an organic material is stacked to cover the inorganic film 77. Polyimide, acrylic resin, or the like is used for the flattening film 80. The flattening film 80 flattens the surface on which the OLED is formed.

On the other hand, in order to prevent water from infiltrating into the OLED from the flattening film 80 or the like, an inorganic film 81 is formed on the flattening film 80. The inorganic film 81 is made of a material that is moisture-proof and has insulation. For example, the inorganic film 81 is formed by using a silicon nitride film or a stacked film of a silicon nitride film and a silicon oxide film.

A pixel electrode 82 of the OLED is disposed on the surface of the inorganic film 81. The pixel electrode 82 is electrically connected to the S/D electrode 78s of the TFT 73 corresponding to the drive TFT 12 of FIG. 1 through the contact hole penetrating the inorganic film 81 and the flattening film 80. It is noted that the pixel electrode 82 may have a structure including a reflective film that reflects the light emitted from the OLED to the display surface side. For example, the pixel electrode 82 can be formed to have a stacked structure of a transparent conductive material such as indium tin oxide (ITO) or indium zinc oxide (IZO) and a reflective material such as silver (Ag).

It is noted that storage capacitance illustrated as the capacitor 14 in FIG. 1 is formed by the source region of the S/D electrode 78s and the semiconductor layer 72 connected to the pixel electrode 82 and a metal layer 76c located therebetween and connected to the gate electrode 76. The conductive film 83 can be disposed under the pixel electrode 82 with the inorganic film 81 interposed therebetween, and by allowing the conductive film 83 to be grounded, for example, a retention capacitance can be formed between the conductive film 83 and the pixel electrode 82. The retention capacitance stabilizes the voltage written in the storage capacitance and contributes to the stable operation of the organic light emitting diode.

The bank 84 made of an insulating material is formed on the surface of the inorganic film 81 on which the pixel electrode 82 is formed. The bank 84 is formed along the periphery of the pixel, covers the end of the pixel electrode 82, and has an opening at a position of a light emitting surface of the OLED. The upper surface of the pixel electrode 82 is exposed at the bottom of the opening, and the organic material layer 85, which is an organic layer including a light emitting layer, is stacked on the surface thereof. The bank 84 is made of polyimide, acrylic resin, or the like.

The upper electrode 86 of the OLED is formed on the organic material layer 85. As described above, the upper electrode 86 can be a common electrode over the entire pixels of the display region. It is noted that the upper electrode 86 is made of a material that transmits light emitted from the organic material layer 85. Specifically, the upper electrode 86 is a thin film made of metal having a low work function and being translucent so that electrons can be efficiently injected into the organic material layer 85. The upper electrode 86 is formed with a film thickness that allows light to pass through the upper electrode, for example, by using an MgAg alloy. By the way, the upper electrode 86 is electrically connected to the wiring 79 through the contact hole 87 provided in the frame region 44 illustrated in the cross section IIIb.

A sealing film that seals the upper surface of the OLED and prevents deterioration of the OLED due to moisture is formed in the display region 42 in which the OLED configured with the pixel electrode 82, the organic material layer 85, and the upper electrode 86 is formed. In the embodiment, the sealing film is a multilayer film configured with two inorganic films 88 and 89 and an organic film 90. The inorganic films 88 and 89 are formed, for example, with a silicon nitride film, and the organic film 90 is formed with acrylic resin or the like. The inorganic film 88 is stacked on the surface of the upper electrode 86 in the display region 42, the organic film 90 is interposed between the inorganic film 88 and the inorganic film 89 in the display region 42, and the inorganic films 88 and 89 have contact regions to be in direct contact with each other and overlap each other in the frame region 44.

Herein, an inorganic film bonding portion 91 in which the inorganic films 88 and 89 and the inorganic film 81 are bonded is provided to the frame region 44. By providing the inorganic film bonding portion 91, it is possible to prevent the infiltration of water from the side into the region interposed between the inorganic films 88 and 89 and the inorganic film 81, so that the prevention of deterioration of the OLED is established. The inorganic film bonding portions 91 are basically provided in a row around the display region 42, so that the infiltration of water can be prevented more effectively.

Figure 4:
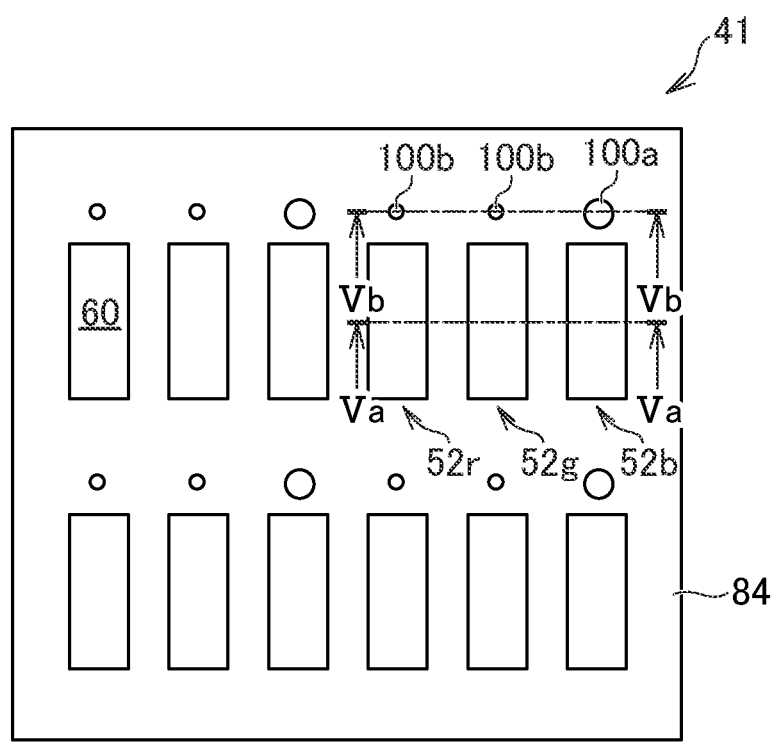
FIG. 4 is a schematic partial plan view of the array substrate in a state after formation of a bank and before formation of an organic material layer in the first embodiment of the present invention.
Figure 5:
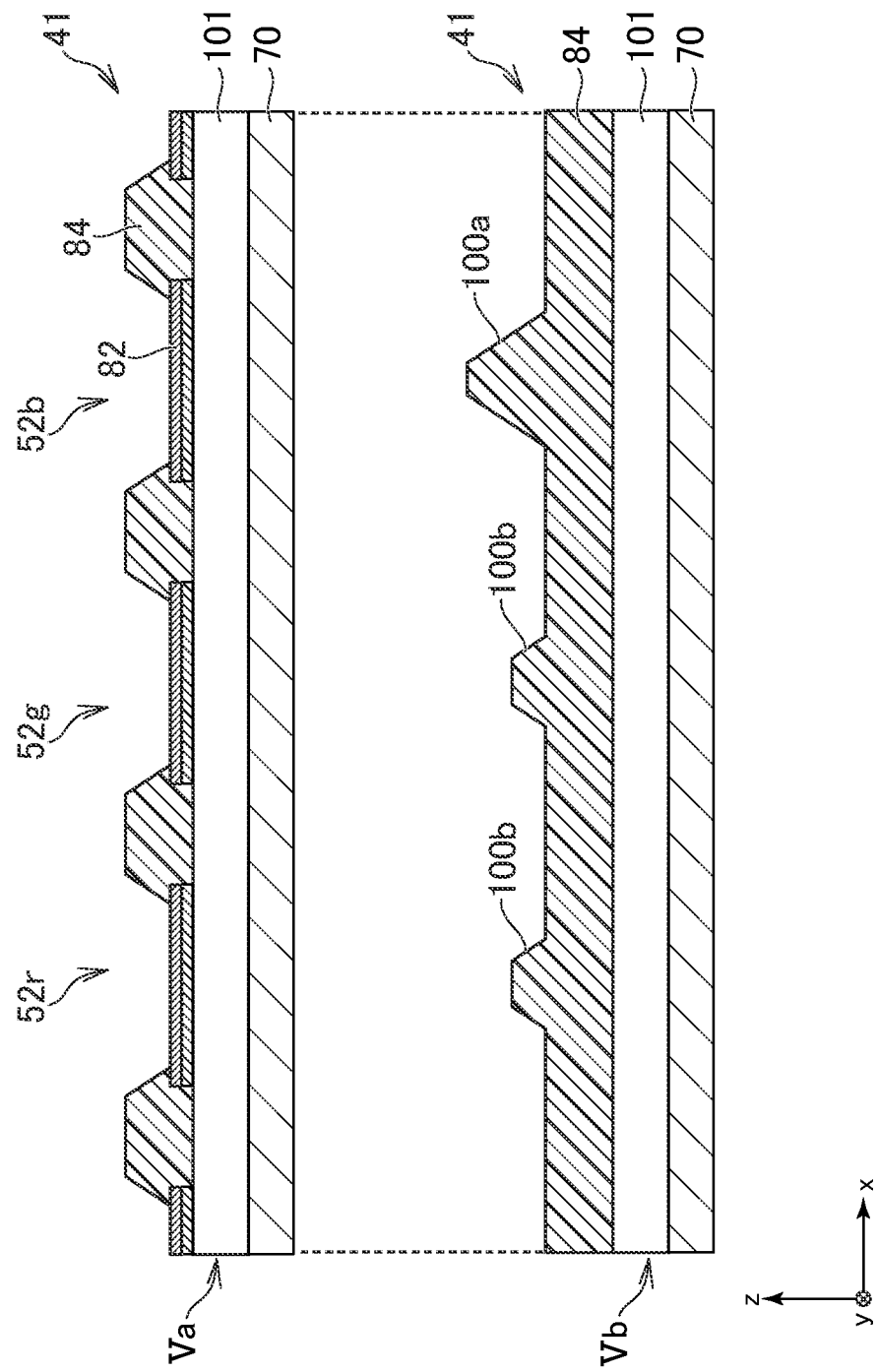
FIG. 5 is a schematic vertical sectional view taken along line Va-Va and line Vb-Vb of the array substrate of FIG. 4.

FIG. 4 is a schematic plan view of a portion of the display region 42 of the array substrate 41 and illustrates a state after the formation of the bank 84 and before the formation of the organic material layer 85. FIG. 5 is a schematic vertical cross-sectional view of a portion of the array substrate 41 in the state, a cross section Va is a cross section taken along the line Va-Va illustrated in FIG. 4, and a cross section Vb is a cross section taken along the line Vb-Vb illustrated in FIG. 4.

In the plan view of FIG. 4, the formation region of the bank 84 and the plurality of pixel apertures 60 in the display region 42 are illustrated, and similarly to FIG. 2, the plurality of pixel apertures 60 correspond to the R pixels 52*r*, the G pixel 52*g*, and the B pixel 52*b* which are formed in stripe arrangement.

Convex portions 100 are formed on the surface of the bank 84. In the embodiment, the convex portions 100 include two types of convex portions 100*a* and 100*b* having different heights. Specifically, the first convex portion 100*a* is higher than the second convex portion 100*b*. That is, if the z-axis is defined in a direction in which the z-coordinate increases according to the height, the z-coordinate of the apex of the first convex portion 100*a* is larger than the z-coordinate of the apex of the second convex portion 100*b*.

The first convex portion 100*a* is basically disposed in the vicinity of a specific type of the pixel aperture 60 among RGB pixels. For example, the first convex portion 100*a* is provided adjacent to each B pixel 52*b*. On the other hand, in the embodiment, the second convex portion 100*b* is disposed adjacent to each R pixel 52*r* and each G pixel 52*g*.

Herein, in the stripe arrangement, the pixel apertures 60 can have an elongated shape in the y direction, and the spacing in the x direction can be formed smaller than the spacing in the y direction. That is, since the bank 84 between the pixels adjacent in the y direction has a width being larger than that between the pixels adjacent in the x direction, it is easy to dispose the convex portion 100. Therefore, in the embodiment, the convex portion 100 is disposed on the bank 84 between the pixel rows. That is, the convex portion 100*a* is provided adjacent to the B pixel 52*b* in the y direction, and the convex portion 100*b* is provided adjacent to each of the R pixel 52*r* and the G pixel 52*g* in the y direction.

The positions of the cross sections Va and Vb in FIG. 5 are the same in the x direction and different in the y direction. It is noted that FIG. 5 is provided to explain the shape and arrangement of the convex portions 100, and most of the structures illustrated in FIG. 3 are not illustrated. For example, the layer 101 forming the array substrate 41 has a stacked structure including the layers from the undercoat layer 71 to the inorganic film 81 of FIG. 3.

The convex portions 100*a* and the convex portions 100*b* are aligned in the x direction on a common straight line, and the convex portions 100*a* and 100*b* adjacent to the respective BGB pixels appear at the x coordinates corresponding to the pixel apertures 60 in the cross section Vb. By the way, the height of the upper end of the bank 84 in the cross section Va corresponds to the height of the lower end of the convex portion 100 in the cross section Vb.

In the embodiment, the convex portion 100 is made of a material common to that of the bank 84, but the convex portion 100 may be made of a material different from that of the bank 84. That is, when the bank 84 is made of polyimide or acrylic resin as described above, the convex portion 100 may be made of the same material, and for example, the convex portion 100 may be made of another organic material such as epoxy or an inorganic material such as silicon nitride.

In the examples of FIGS. 4 and 5, the convex portion 100 has a shape with trapezoidal vertical cross section and a circular planar shape, but other shapes may be used.

Figure 6:
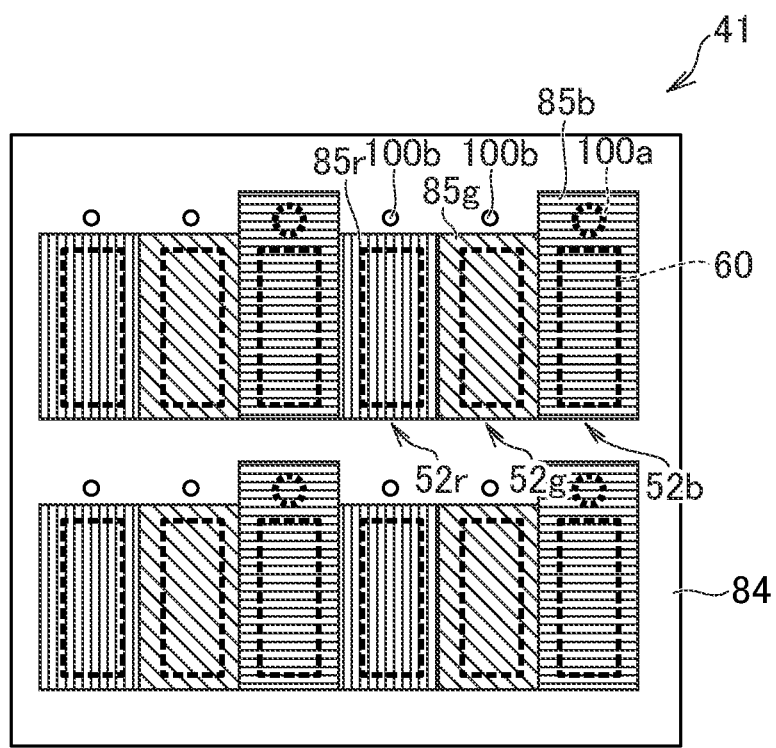
FIG. 6 is a schematic partial plan view of the array substrate corresponding to FIG. 4 in a state after formation of an organic material layer.

FIG. 6 is a schematic plan view after the formation of the organic material layer 85 in a portion of the display region 42 of the array substrate 41 corresponding to FIG. 4. By the manufacturing method described later, an organic material layer 85*b* is formed in the pixel electrode 82 exposed on the bottom surface of the pixel aperture 60 of the B pixel 52*b* and a rectangular region including surroundings thereof, and organic material layers 85*r* and 85*g* are formed in the pixel electrode 82 exposed on the bottom surface of the pixel aperture 60 and each of the R pixel 52*r* and the G pixel 52*g* and a rectangular region including surroundings thereof.

Herein, the first convex portion 100*a* is covered by the organic material layer 85*b* of the adjacent B pixel 52*b*, but the second convex portion 100*b* is not covered by the organic material layer 85 of any pixel. In other words, the organic material layer 85*b* of the B pixel 52*b* among the RGB pixels is provided to cover only the first convex portion 100*a* among the convex portions 100*a* and 100*b*, and the organic material layers 85*r* and 85*g* of the R pixel 52*r* and the G pixel 52*g* are provided not to cover any one of the first convex portion 100*a* and the second convex portion 100*b*.

Next, an embodiment relating to the method for manufacturing the display device of the present invention will be described. The manufacturing method of the embodiment is basically different from the manufacturing method in the related art in the viewpoints that manufacturing method of the embodiment has a process of forming the above-mentioned convex portion 100 and a method of forming the organic material layer 85 is different. Among the viewpoints, the feature of the manufacturing method according to the present invention is mainly related to the viewpoint of the formation of the organic material layer 85, particularly the viewpoint that the organic material layer 85 is formed by using the convex portion 100, and thus, hereinafter, the viewpoint will be described with reference to FIGS. 7 to 12. The convex portion 100 can be formed by a well-known process which is the same as or similar to forming the pixel aperture 60 in the bank 84, and specifically, the convex portion 100 can be formed by etching a film such as resin stacked on the surface of the array substrate 41 by using photolithography technology.

The three types of organic material layers 85r, 85g, and 85b corresponding to the three emission colors are formed by the separate coating method. Specifically, a vapor deposition mask having openings corresponding to the respective film formation positions is prepared for each of the three types of organic material layers, and the organic material layers 85r, 85g, and 85b are sequentially vapor-deposited on the surface of the array substrate 41 by using the vapor deposition mask.

In the embodiment, the organic material layer 85b is first formed in the B pixel 52b adjacent to the first convex portion 100a, and after that, the organic material layers 85g and 85r are sequentially formed in the G pixel 52g and the R pixel 52r.

Figure 7:
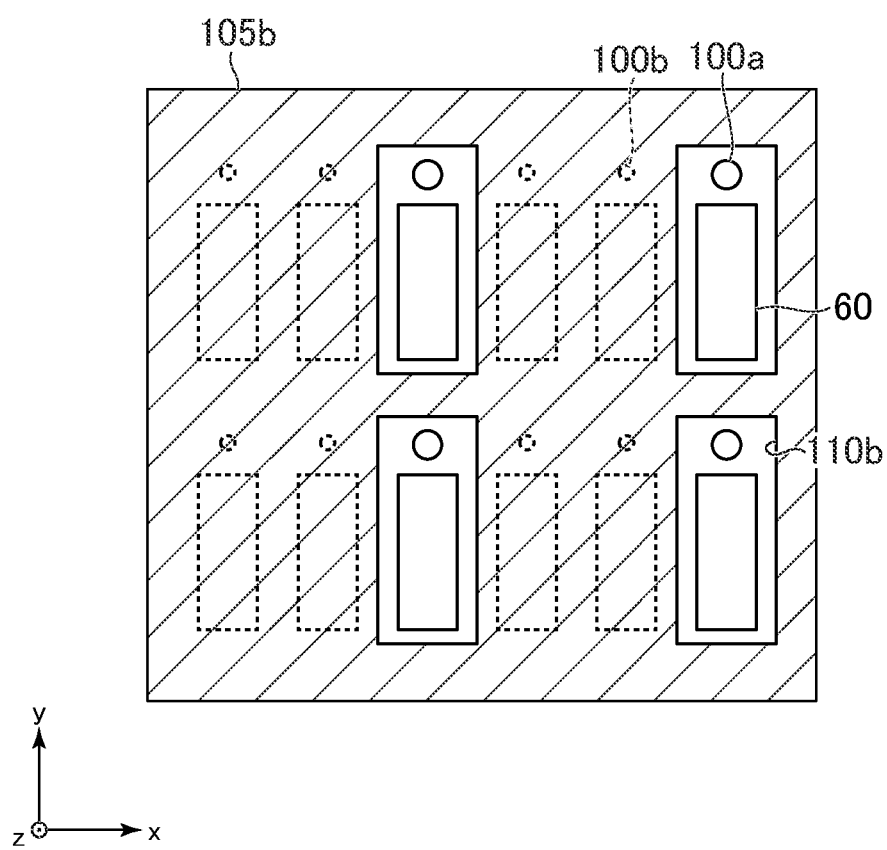
FIG. 7 is a schematic plan view of a vapor deposition mask for B disposed on the array substrate illustrated in FIG. 4.
Figure 8:
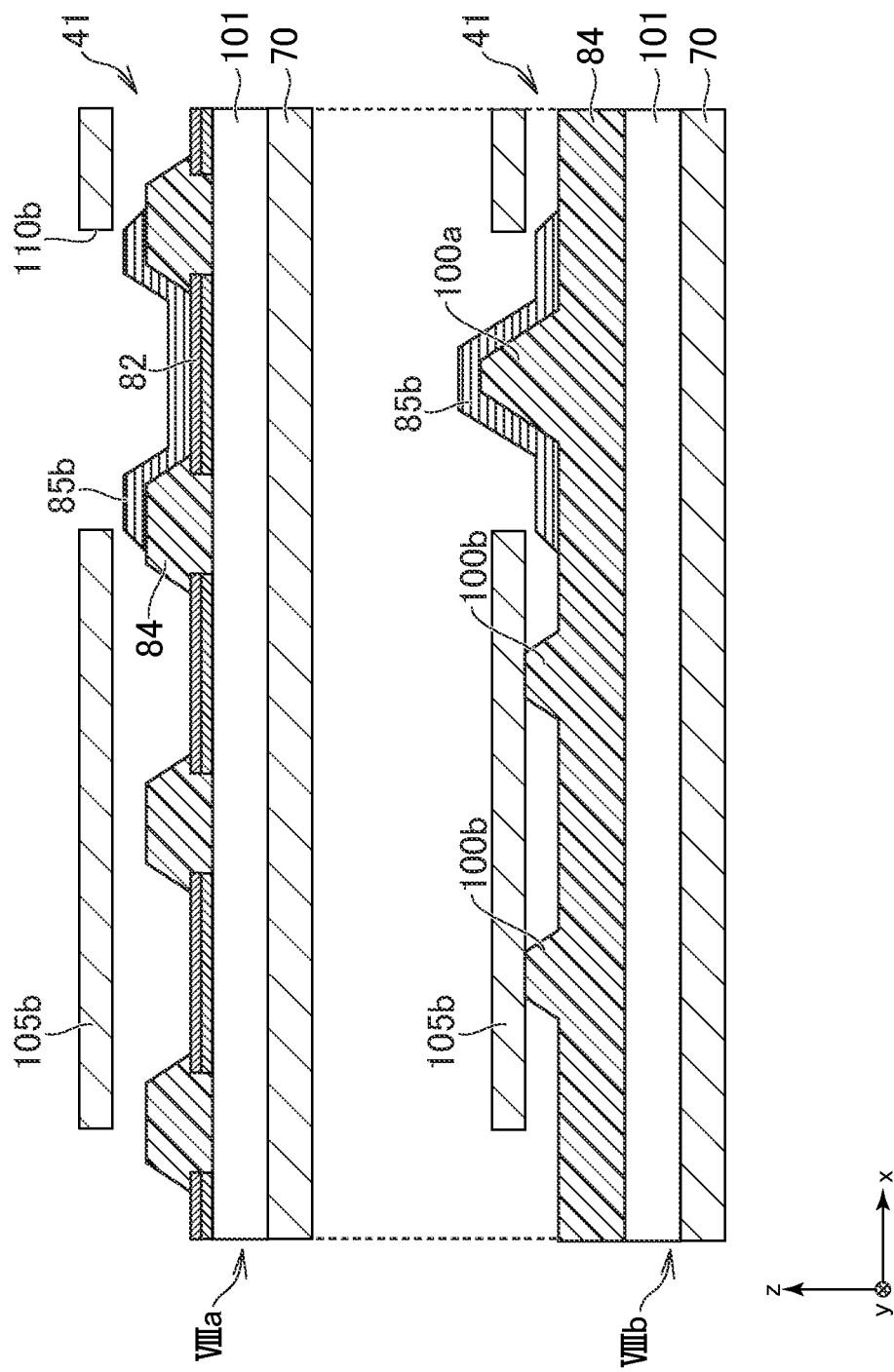
FIG. 8 is a schematic vertical sectional view of the array substrate and the vapor deposition mask in a state where an organic material layer of B pixels is vapor-deposited.
Figure 9:
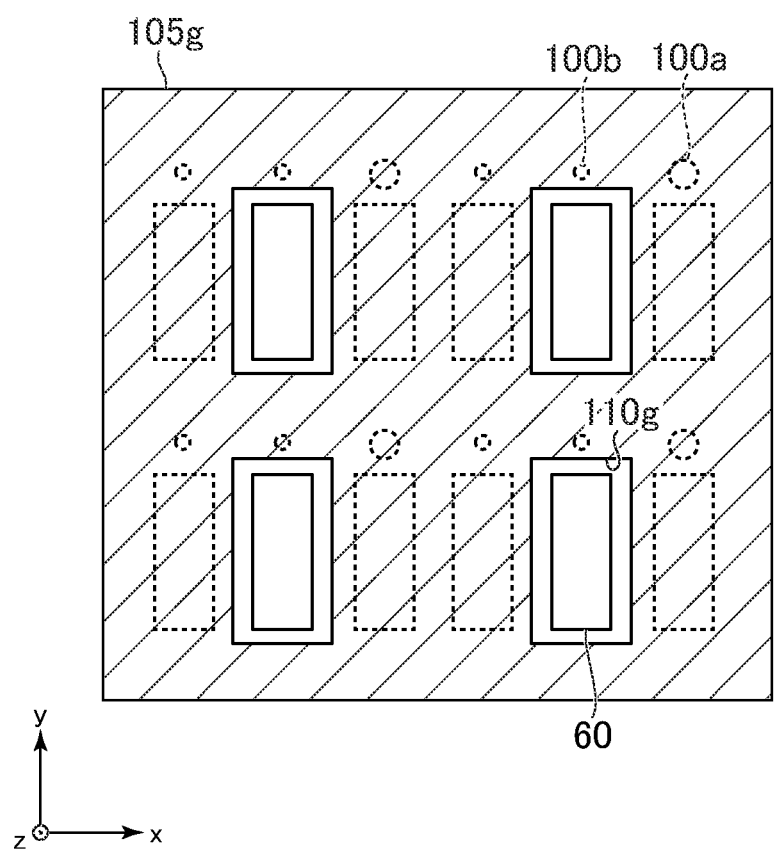
FIG. 9 is a schematic plan view of a vapor deposition mask for G disposed on the array substrate illustrated in FIG. 4.
Figure 10:
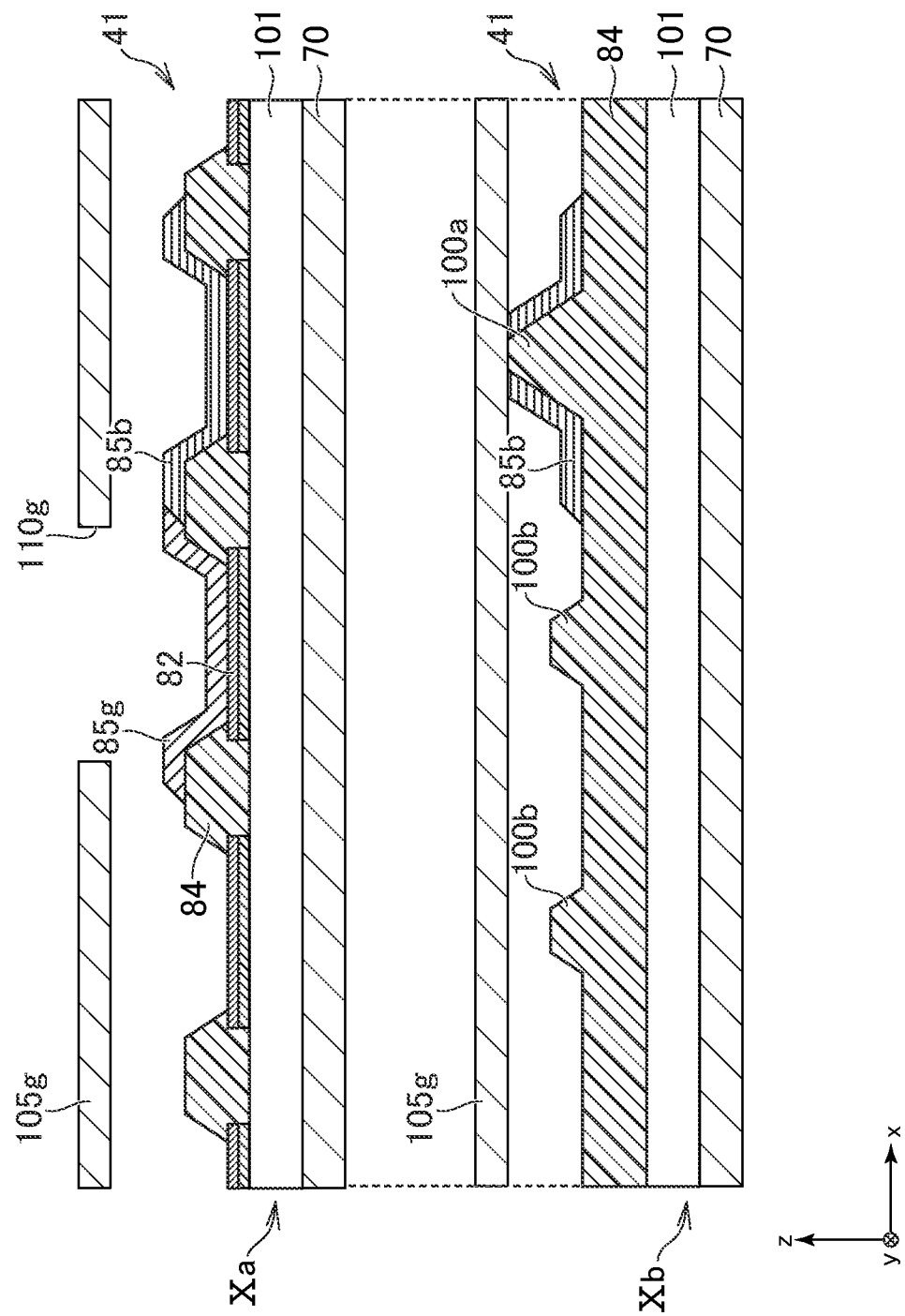
FIG. 10 is a schematic vertical sectional view of the array substrate and the vapor deposition mask in a state where an organic material layer of G pixels is vapor-deposited.
Figure 11:
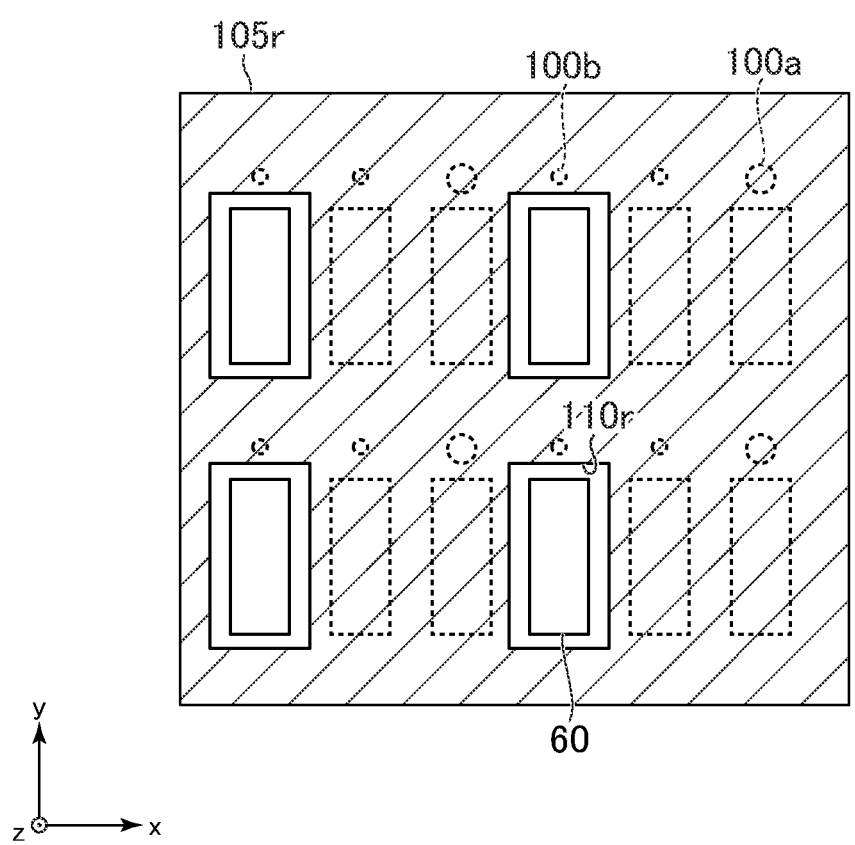
FIG. 11 is a schematic plan view of a vapor deposition mask for R disposed on the array substrate illustrated in FIG. 4.
Figure 12:
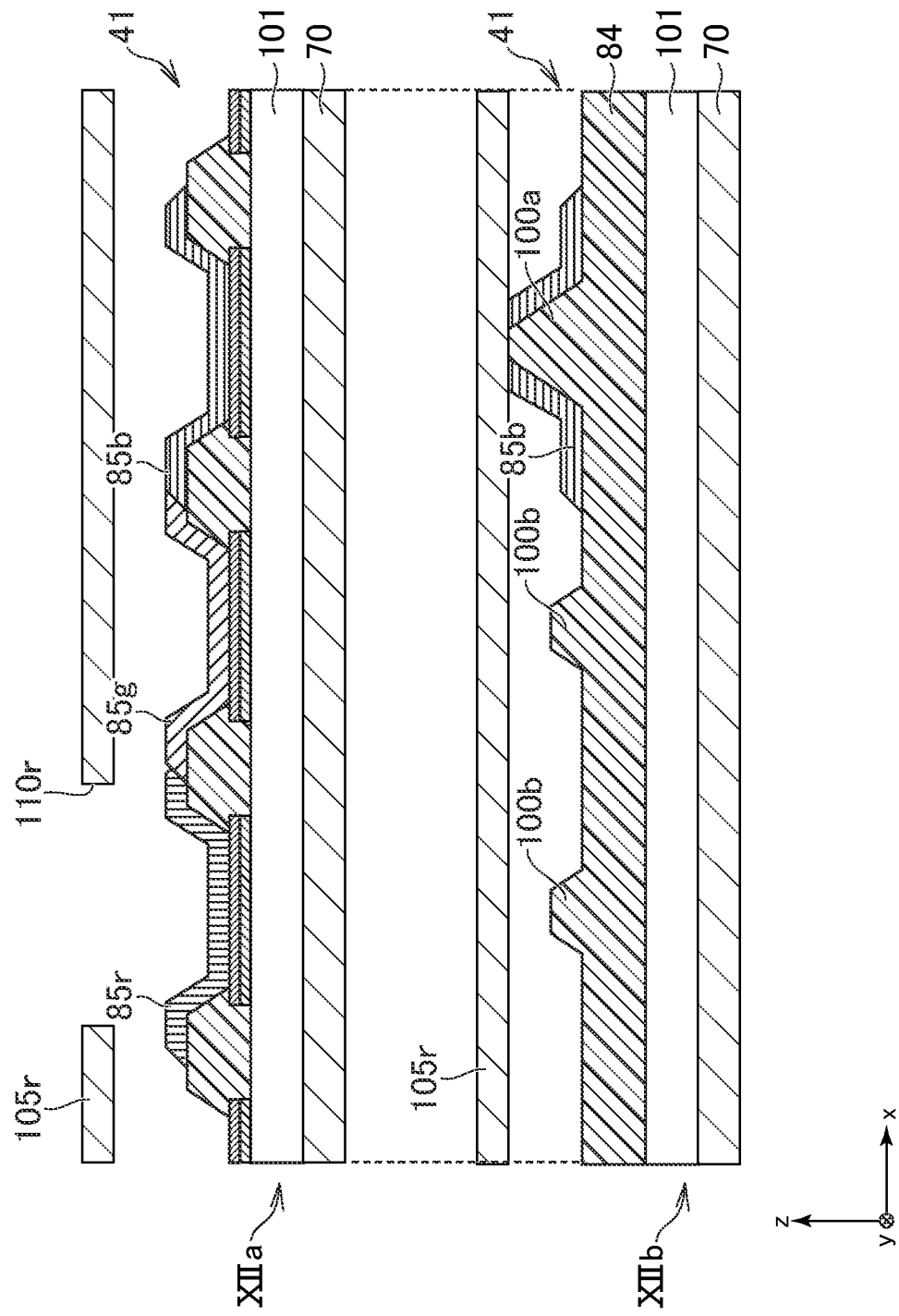
FIG. 12 is a schematic vertical cross-sectional view of the array substrate and the vapor deposition mask in a state where an organic material layer of R pixels is vapor-deposited.

FIGS. 7 and 8 are diagrams illustrating the process of forming the organic material layer 85b, FIGS. 9 and 10 are diagrams illustrating the process of forming the organic material layer 85g, and FIGS. 11 and 12 are diagrams illustrating the process of forming the organic material layer 85r. FIGS. 7, 9, and 11 are schematic plan views of the vapor deposition masks for B, G, and R, respectively, and are illustrated in association with the array substrate 41 illustrated in FIG. 4.

As illustrated in FIG. 7, by disposing a vapor deposition mask 105b for B on the array substrate 41 on which the bank 84 and the convex portion 100 illustrated in FIGS. 4 and 5 are formed and performing the vapor deposition process, the organic material layer 85b is formed. FIG. 8 is a schematic vertical sectional view of the array substrate 41 and the vapor deposition mask 105b in a state where the organic material layer 85b is vapor-deposited and is illustrated in association with the sectional view of FIG. 5. That is, a cross section VIIIa is a vertical cross section at a position taken along the line Va-Va illustrated in FIG. 4, and a cross section VIIIb is a vertical cross section at a position taken along the line Vb-Vb illustrated in FIG. 4.

An opening 110b of the vapor deposition mask 105b for B is formed in a shape and size including the pixel aperture 60 of only the B pixels 52b among the RGB pixels on the array substrate 41 and also including the first convex portion 100a adjacent to the B pixels 52b. Therefore, when the vapor deposition mask 105b is disposed on the array substrate 41, as illustrated in the cross section VIIIb of FIG. 8, the first convex portion 100a is not in contact with the vapor deposition mask 105b and the upper end of the second convex portion 100b is lower than the first convex portion 100a, which is in contact with the back surface of the vapor deposition mask 105b to support the vapor deposition mask 105b. That is, the first convex portion 100a does not function as a spacer that defines the height of the vapor deposition mask 105b on the array substrate 41, and the second convex portion 100b lower than the first convex portion 100a functions as the spacer.

When the vapor deposition is performed by using the vapor deposition mask 105b, as illustrated in the cross section VIIIa of FIG. 8 and FIG. 6, the organic material layer 85b is stacked on the pixel aperture 60 of the B pixel 52b, and as illustrated in the cross section VIIIb of FIG. 8 and FIG. 6, the first convex portion 100a is also covered.

Next, as illustrated in FIG. 9, a vapor deposition mask 105g for G is disposed on the array substrate 41 on which the organic material layer 85b is formed, and the vapor deposition process is performed to form the organic material layer 85g. FIG. 10 is a schematic vertical sectional view of the array substrate 41 and the vapor deposition mask 105g in a state where the organic material layer 85g is vapor-deposited, and is illustrated in association with the sectional view of FIG. 5. That is, a cross section Xa is a vertical cross section at a position taken along the line Va-Va illustrated in FIG. 4, and a cross section Xb is a vertical cross section at a position taken along the line Vb-Vb illustrated in FIG. 4.

An opening 110g of the vapor deposition mask 105g for G is formed in a shape and size including the pixel aperture 60 of only the G pixels 52g among the RGB pixels on the array substrate 41 while not including any of the convex portions 100. Therefore, when the vapor deposition mask 105g is disposed on the array substrate 41, as illustrated in the cross section Xb of FIG. 10, the upper end of the first convex portion 100a higher than the second convex portion 100b is in contact with the back surface of the vapor deposition mask 105g to support the vapor deposition mask 105g. That is, the first convex portion 100a functions as a spacer that defines the height of the vapor deposition mask 105g on the array substrate 41.

When vapor deposition is performed by using the vapor deposition mask 105g, the organic material layer 85g is stacked on the pixel aperture 60 of the G pixel 52g as illustrated in the cross section Xa of FIG. 10 and FIG. 6. On the other hand, the organic material layer 85g does not cover any one of the first convex portion 100a and the second convex portion 100b as illustrated in the cross section Xb of FIG. 10 and FIG. 6.

As illustrated in FIG. 11, by disposing a vapor deposition mask 105r for R on the array substrate 41 on which the organic material layers 85b and 85g are formed and by performing the vapor deposition process, the organic material layer 85r is formed. FIG. 12 is a schematic vertical sectional view of the array substrate 41 and the vapor deposition mask 105r in a state where the organic material layer 85r is vapor-deposited, and is illustrated in association with the sectional view of FIG. 5. That is, a cross section XIIa is a vertical cross section at a position taken along the line Va-Va illustrated in FIG. 4, and a cross section XIIb is a vertical cross section at a position taken along the line Vb-Vb illustrated in FIG. 4.

An opening 110r of the vapor deposition mask 105r for R is formed in a shape and size including the pixel aperture 60 of only the R pixel 52r among the RGB pixels on the array substrate 41 while not including any of the convex portions 100 similarly to the vapor deposition mask 105g for G. Therefore, when the vapor deposition mask 105r is disposed on the array substrate 41, as illustrated in the cross section XIIb of FIG. 12, the first convex portion 100a functions as a spacer that defines the height of the vapor deposition mask 105r on the array substrate 41.

When vapor deposition is performed by using the vapor deposition mask 105r, the organic material layer 85r is stacked on the pixel aperture 60 of the R pixel 52r as illustrated in the cross section XIIa of FIG. 12 and FIG. 6, while any one of the first convex portion 100a and the second convex portion 100b is not covered as illustrated in the cross section XIIb of FIG. 12 and FIG. 6.

When the plurality of types of organic material layers 85 are separately coated by a plurality of vapor deposition processes, as described above, the vapor deposition mask 105 used in the first vapor deposition process has an opening 110 into which the first convex portion 100a enters, and thus, the second convex portion 100b serves as a spacer for the vapor deposition mask 105. Accordingly, as compared with the case where the first convex portion 100a serves as a spacer, the distance between the array substrate 41 and the vapor deposition mask 105 can be reduced, and thus, the vapor deposition can be performed with high positional accuracy.

On the other hand, the first convex portion 100a does not enter into the opening 110 of the vapor deposition mask 105 used in the second and subsequent vapor deposition processes, and the first convex portion 100a serves as a spacer for the vapor deposition mask 105. Accordingly, the distance between the array substrate 41 and the vapor deposition mask 105 can be increased by the first vapor deposition process, and thus, the foreign matter adhering to the vapor deposition mask 105 does not destroy the organic material layer already vapor-deposited on the array substrate 41, so that it is possible to establish reducing the possibility of occurrence of display defects.

It is noted that, in a case where the first convex portion 100a is used as a spacer, as compared with the case where the second convex portion 100b is used as a spacer, according to the increase in the distance between the vapor deposition mask 105 and the array substrate 41, a wraparound of a vapor deposition material to the region shielded by the vapor deposition mask 105 can also be increased. Therefore, considering the influence of the wraparound, the opening 110 of the vapor deposition mask 105 used in the second and subsequent vapor deposition processes may be formed to be small in advance.

Second Embodiment

In the first embodiment, the example in which the R pixel 52r, the G pixel 52g, and the B pixel 52b are formed in a stripe arrangement in the display region has been described. However, the present invention can also be applied to a display device having a pixel arrangement other than the stripe arrangement.

As a second embodiment, an organic EL display device 2 having an arrangement of RGB pixels different from that of the first embodiment will be described. Herein, the basic difference between the second embodiment and the first embodiment is the arrangement of RGB pixels, and other configurations, for example, many contents described in FIGS. 1 to 3 can be basically common, so that the description thereof will be omitted herein.

Figure 13:
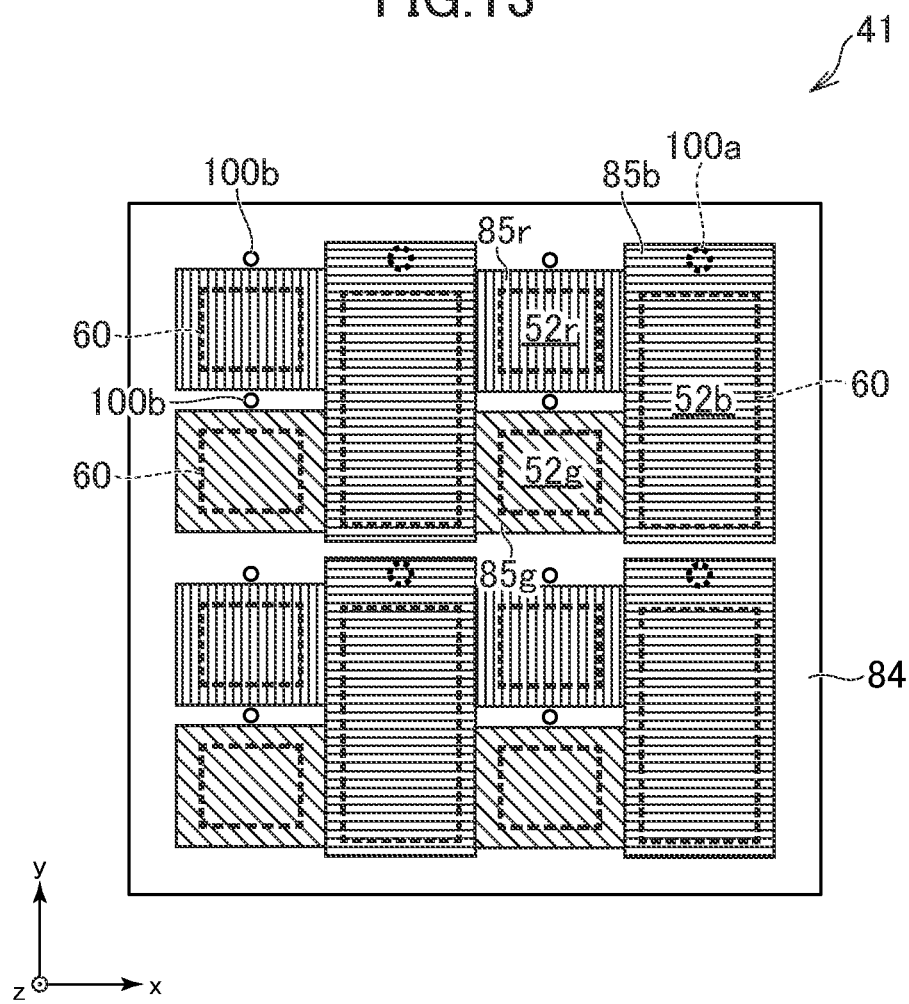
FIG. 13 is a schematic partial plan view of an array substrate in a state after formation of an organic material layer in a second embodiment of the present invention.

FIG. 13 is a schematic plan view of a portion of the display region 42 of the array substrate 41 of the organic EL display device 2 according to the second embodiment and illustrates a state after the formation of the organic material layer 85. The plan view of FIG. 13 illustrates the positions of the formation region of the bank 84, the pixel apertures 60 and the organic material layers 85r, 85g, and 85b of the respective R pixels 52r, the G pixels 52g, and the B pixels 52b, the first convex portion 100a and the second convex portion 100b in the display region 42.

In one pixel configured with three sub-pixels that are the R pixel 52r, the G pixel 52g, and the B pixel 52b, the R pixel 52r and the G pixel 52g are aligned in the y direction, and the B pixel 52b is disposed adjacent to the x direction thereof. In such pixel configuration, as illustrated in FIG. 13, for example, columns in which the R pixels 52r and the G pixels 52g are alternately aligned and columns in which only the B pixels 52b are aligned are alternately disposed in the row direction in the display region 42.

Similarly to the first embodiment, in the embodiment, the first convex portion 100a is provided adjacent to each B pixel 52b, and the second convex portion 100b is provided adjacent to each R pixel 52r and each G pixel 52g. Then, similarly to the first embodiment, the organic material layer 85b of the B pixel 52b is provided to cover only the first convex portion 100a among the two types of convex portions 100, and the organic material layers 85r and 85g of the R pixel 52r and the G pixel 52g, respectively, are provided not to cover any one of the two types of convex portions 100a and 100b.

Figure 14:
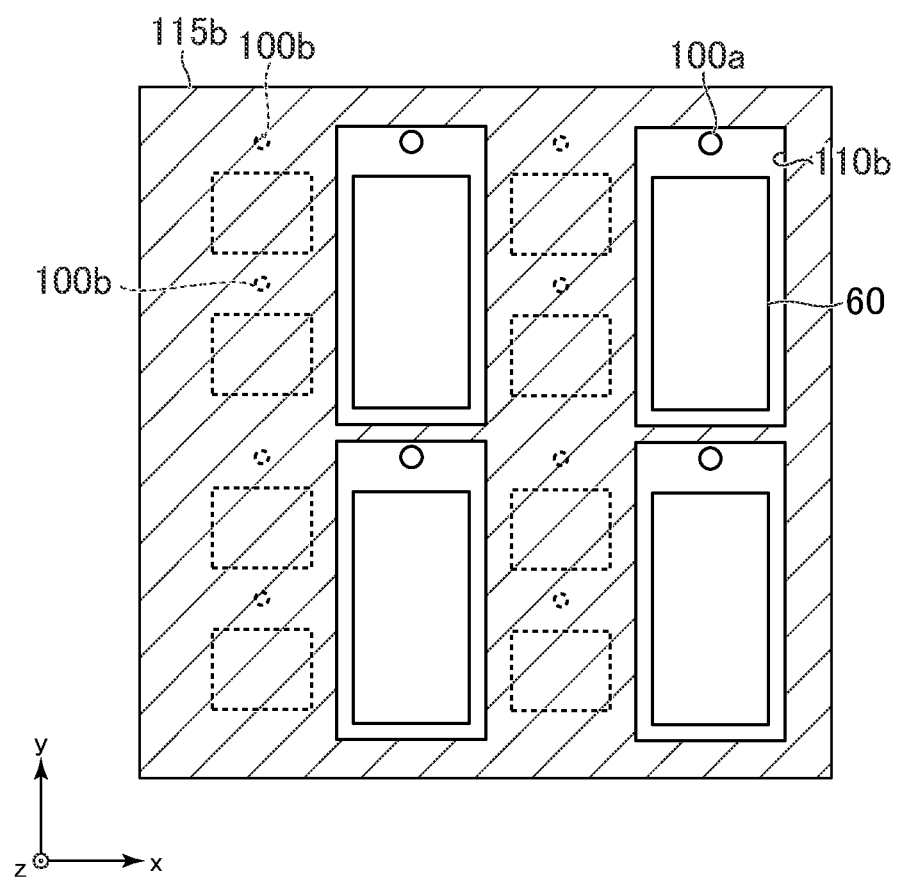
FIG. 14 is a schematic plan view of a vapor deposition mask for B disposed on the array substrate according to the second embodiment of the present invention.
Figure 15:
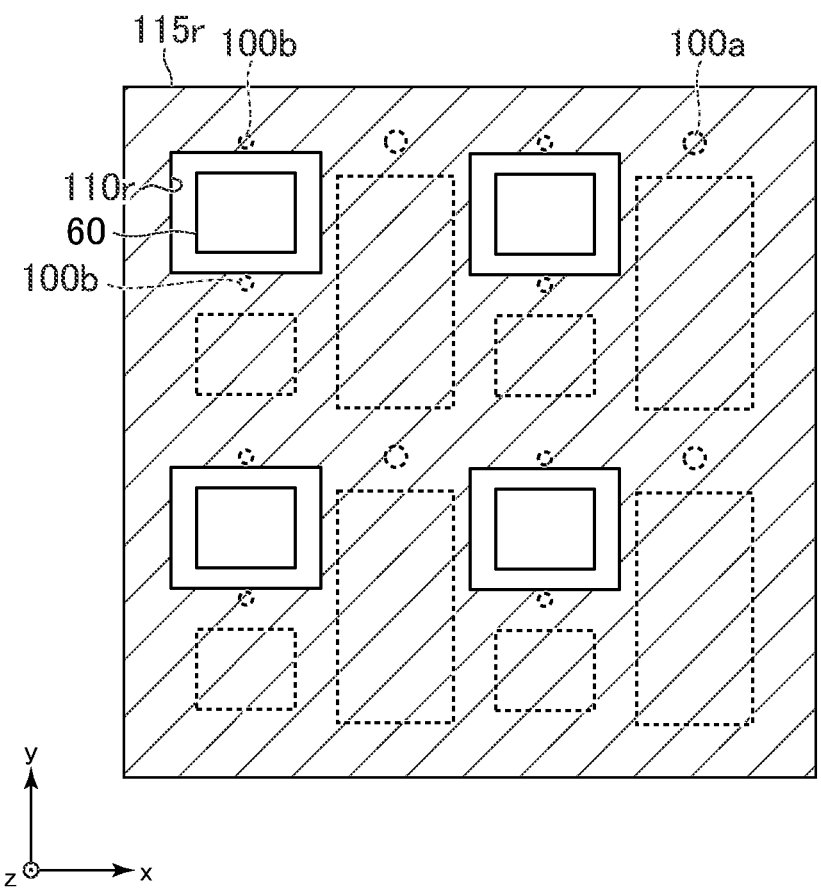
FIG. 15 is a schematic plan view of a vapor deposition mask for R disposed on the array substrate according to the second embodiment of the present invention.
Figure 16:
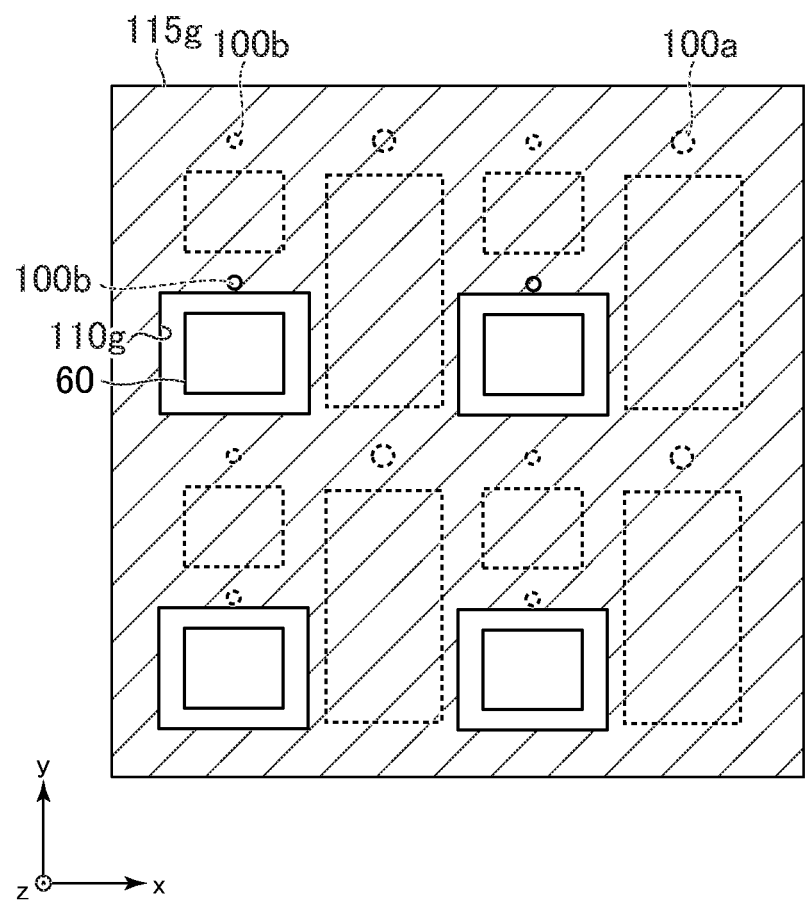
FIG. 16 is a schematic plan view of a vapor deposition mask for G disposed on the array substrate according to the second embodiment of the present invention.

FIGS. 14, 15, and 16 are schematic plan views of the vapor deposition masks for B, R, and G, respectively, and are illustrated in association with the array substrate 41 illustrated in FIG. 13. Similarly to the vapor deposition mask 105b of the first embodiment, an opening 110b of a vapor deposition mask 115b for B is formed on the array substrate 41 in a shape and size including the pixel aperture 60 of the B pixel 52b and also including the first convex portion 100a which is adjacent to the B pixel 52b. Similarly to the vapor deposition masks 105r and 105b of the first embodiment, the openings 110r and 110g of the vapor deposition masks 105r and 105g for R and G are formed in a shape and size including the pixel apertures 60 of the R pixel 52r and the G pixel 52g, respectively, but not including any one of the convex portions 100.

By using the vapor deposition masks 115, the organic material layer 85 of each pixel is formed by a manufacturing method basically the same as that of the first embodiment. That is, the organic material layer 85b of the B pixel 52b is formed by supporting the vapor deposition mask 115b on the array substrate 41 by using the second convex portion 100b as a spacer, and the organic material layers 85r and 85b of the R pixel 52r and the B pixel 52b are formed by supporting vapor deposition masks 115r and 115b on the array substrate 41 by using the first convex portion 100a as a spacer.

Therefore, also in the organic EL display device 2 according to the second embodiment, similarly to the first embodiment, by forming the OLED by the separate coating method, it is possible to improve the vapor deposition position accuracy and reduce the possibility of occurrence of display defects.

Modified Example (1) With respect to the vapor deposition of the organic material layer 85, the pixel which uses the lower convex portion among the two types of convex portions 100 as a spacer for the vapor deposition mask, and vapor deposition process is firstly performed on is referred to as the preceding vapor deposition pixel, and among the plurality of types of pixels, after the preceding vapor deposition pixel, the pixel which the vapor deposition process is performed on by using the higher convex portion among the two types of convex portions 100 as a spacer is referred to as a subsequent vapor deposition pixel. In the above-described embodiment, the B pixel is set as a preceding vapor deposition pixel, and the G pixel and the R pixel are set as subsequent vapor deposition pixels. However, which one of the plurality of types of pixels is used as the preceding vapor deposition pixel can be basically arbitrarily determined, and from the viewpoint of the present invention, the order of vapor deposition between the subsequent vapor deposition pixels can also be basically arbitrarily determined.

(2) As already described, when the higher convex portion among the two types of convex portions 100 is used as the spacer of the vapor deposition mask, according to the increase in the distance between the vapor deposition mask and the array substrate, the wraparound of the vapor deposition material on the shield region of the vapor deposition mask is increased, and thus, the vapor deposition position accuracy can be lower than that of the case where the low convex portion 100 is used as a spacer. As one of the countermeasures, it has already been described that the opening of the vapor deposition mask in which the high convex portion 100 serves as a spacer is formed to be small.

Herein, the pixel apertures of the plurality of types of sub-pixels having different emission colors can be set to different sizes depending on the emission efficiency and the visual sensitivity characteristics of the light emitting layer of each color. When an aperture size of the vapor deposition mask is the same, pixels having small pixel apertures are less susceptible to misalignment of the vapor deposition region than pixels having large pixel apertures. Therefore, among a plurality of types of pixels, the pixel having a large pixel aperture may be used as a preceding vapor deposition pixel, and the pixel having a small pixel aperture may be used as a subsequent vapor deposition pixel. By doing so, it is possible to ensure the vapor deposition position accuracy even when it is difficult to further miniaturize the opening of the vapor deposition mask due to the progress and the like of reduction of the pixel aperture.

Figure 17:
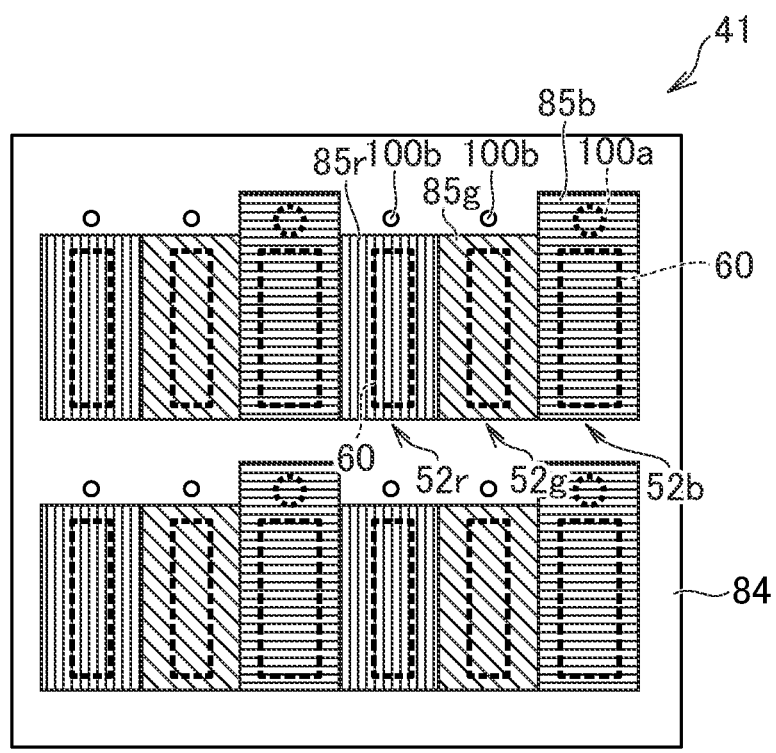
FIG. 17 is a schematic partial plan view of an array substrate for explaining a modified example of the present invention.

FIG. 17 illustrates an example thereof. Specifically, FIG. 17 is a schematic plan view of a portion of the display region 42 of the array substrate 41 of the organic EL display device 2 having a stripe arrangement similarly to the first embodiment and illustrates a state after the formation of the organic material layer 85. In a layout of the pixels of FIG. 17, the pixel aperture 60 of the R pixel 52r and the G pixel 52g is smaller than that of the B pixel 52b. Corresponding to the difference in the size of the pixel aperture, the first convex portion 100a is disposed in the vicinity of the B pixel 52b, the B pixel 52b is used as the preceding vapor deposition pixel, and the R pixel 52r and the G pixel 52g are used as the subsequent vapor deposition pixels.

(3) The first convex portion 100a does not need to be disposed adjacent to each of the preceding vapor deposition pixels and can be disposed at a density that preferably supports the vapor deposition mask of the subsequent vapor deposition pixels. Specifically, the convex portions 100a can be thinned out at a density in which bending of the vapor deposition mask of the subsequent vapor deposition pixels does not occur between the convex portions 100a serving as the spacer or the influence of the bending on the vapor deposition position accuracy can be ignored.

From the same viewpoint, the second convex portion 100b can also be thinned out. For example, in the above-described embodiment, the arrangement density of the convex portions 100b is basically twice that of the convex portions 100a, but when the strength of the vapor deposition mask is the same for the R pixel, the G pixel, and the B pixel, it is possible to allow the density of the convex portions 100b to be basically the same as that of the convex portion 100a.

Figure 18:
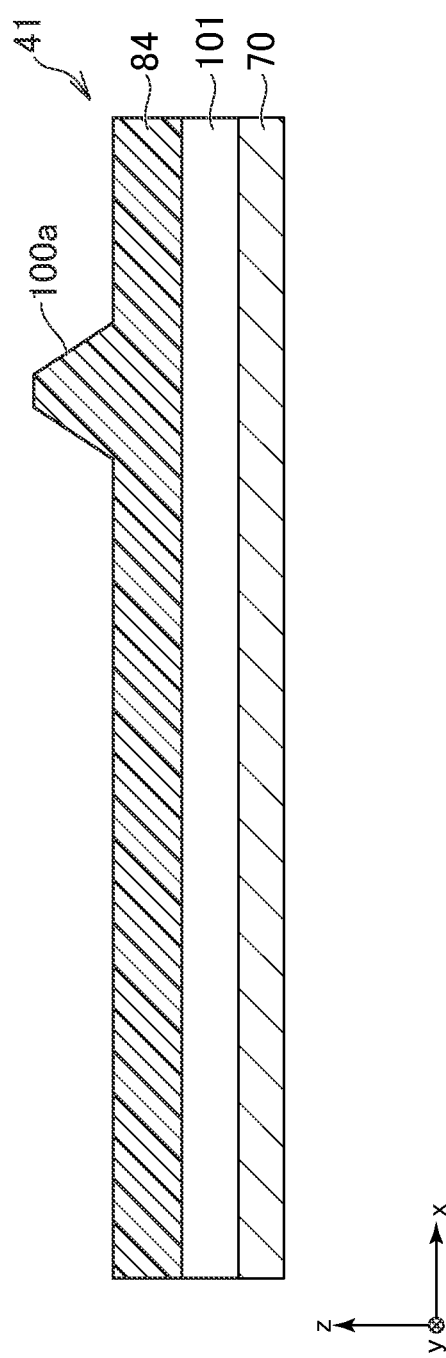
FIG. 18 is a schematic partial vertical sectional view of an array substrate for explaining a modified example of the present invention.

(4) The bank 84 may be configured as a substitute for the second convex portion 100b. FIG. 18 is a schematic vertical cross-sectional view of a portion of the array substrate 41 having the configuration and is a cross-sectional view taken along the line Vb-Vb illustrated in FIG. 4. That is, in the present configuration, the cross section taken along the line Va-Va illustrated in FIG. 4 is the same as the cross section Va in FIG. 5, but the cross section taken along the line Vb-Vb becomes the cross section in FIG. 18 instead of the cross section Vb in FIG. 5. In the present configuration, the second convex portion 100b illustrated in the cross section Vb or the like of FIG. 5 is not formed on the bank 84, and the bank 84 itself functions as the second convex portion 100b. That is, when the organic material layer 85b of the B pixel 52b is vapor-deposited, the upper surface of the bank 84 supports the vapor deposition mask 105b and functions as a spacer that holds the vapor deposition mask 105b above the pixel electrode exposed on the bottom surface of the pixel aperture 60. On the other hand, when the organic material layers 85g and 85r of the G pixel 52g and the R pixel 52r are vapor-deposited, the first convex portion 100a supports the vapor deposition masks 105g and 105r.

Figure 19:
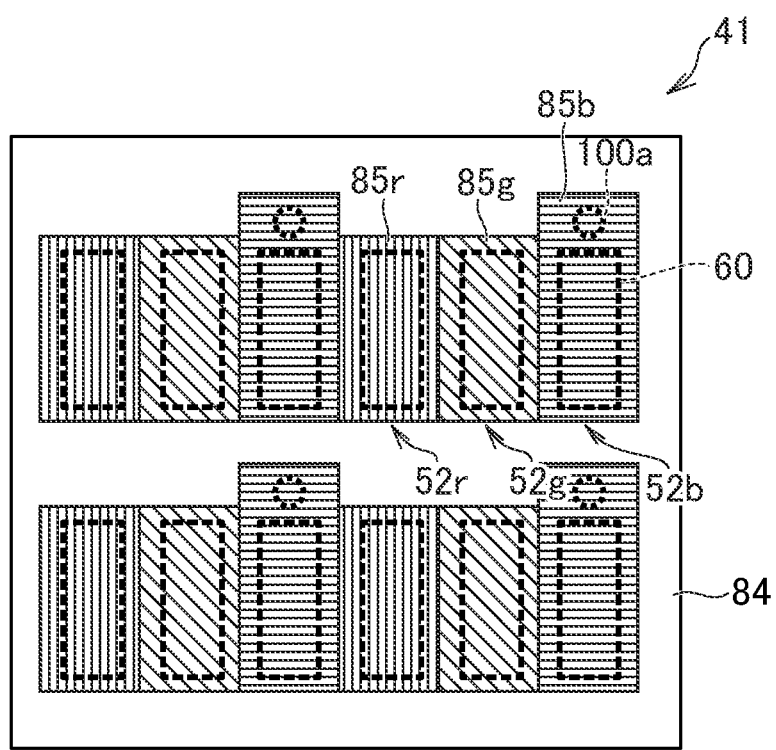
FIG. 19 is a schematic partial plan view of the array substrate of FIG. 18 in a state after formation of the organic material layer.

FIG. 19 is a schematic partial plan view of the array substrate 41 of FIG. 18 after the formation of the organic material layer 85. The array substrate 41 of FIG. 19 is different from that of FIG. 6 in that the second convex portion 100b is not provided, but the array substrate 41 of FIG. 19 is basically the same as that of FIG. 6 in other viewpoint. In particular, similarly to FIG. 6, the first convex portion 100a is covered with the organic material layer 85b.

(5) In the above-described embodiment, the first convex portion 100a is disposed adjacent to the B pixel 52b used as the preceding vapor deposition pixel. As a result, the opening of the vapor deposition mask of the preceding vapor deposition pixel can be formed as one hole in which the portion provided corresponding to the pixel aperture and the portion into which the first convex portion 100a enters can be integrated, and thus, the formation of the opening of the vapor deposition mask is facilitated.

On the other hand, the opening on the pixel aperture and the opening into which the first convex portion 100a enters may be formed separately from each other in the vapor deposition mask of the preceding vapor deposition pixel.

The present invention is not limited to the above-described embodiments and modified examples, and various modifications are possible. For example, the configurations described in the embodiments can be replaced with substantially the same configurations, configurations that exhibit the same functions and effects, or configurations that can achieve the same object.

What is claimed is:

1. A display device comprising:
   a substrate including a display region that includes a plurality of pixels;
   a first pixel electrode included in one of the plurality of pixels, the first pixel electrode being provided over a surface of the substrate;
   a second pixel electrode included in another one of the plurality of pixels, the second pixel electrode being provided over the surface of the substrate;
   a first convex portion adjacent to the first pixel electrode;
   a second convex portion adjacent to the second pixel electrode;
   a first organic layer including a layer exhibiting a first emission color and being stacked on the first pixel electrode; and
   a second organic layer including a layer exhibiting a second emission color and being stacked on the second pixel electrode, wherein
   each of the first convex portion and the second convex portion is in the display region,
   an apex of the first convex portion is farther from the surface of the substrate than an apex of the second convex portion,
   the first organic layer is further provided to cover only the first convex portion of the convex portions, and
   the second organic layer is provided not to cover any one of the first convex portion and the second convex portion.

2. The display device according to claim 1, further comprising a bank formed in a periphery of the first pixel and the second pixel, covering an end of each of the first pixel electrode and the second pixel electrode, and having an opening that exposes an upper surface of each of the first pixel electrode and the second pixel electrode, wherein the first convex portion and the second convex portion are provided on the bank.

3. A method for manufacturing a display device, the method comprising steps of:

preparing a substrate on which a display region which displays an image configured with a plurality of pixels is formed, the substrate including a first pixel electrode included in one of the plurality of pixels, the first pixel electrode being provided over a surface of the substrate, and a second pixel electrode included in another one of the plurality of pixels, the second pixel electrode being provided over the surface of the substrate, and a first convex portion provided adjacent to the first pixel electrode and a second convex portion provided adjacent to the second pixel electrode, each of the first convex portion and the second convex portion is provided in the display region;

disposing a first vapor deposition mask having an opening in a region of the substrate facing the first pixel electrode and the first convex portion and having a shielding portion in a region facing the second convex portion;

forming a first organic layer including a layer exhibiting a first emission color to cover the first pixel electrode and the first convex portion and not to cover the second convex portion by a vapor deposition process through the first vapor deposition mask;

disposing a second vapor deposition mask having an opening in a region of the substrate facing the second pixel electrode and having a shielding portion in a region facing the first convex portion and the second convex portion on the substrate; and forming a second organic layer including a layer exhibiting a second emission color to cover the second pixel electrode and not to cover the first convex portion and the second convex portion by a vapor deposition process through the second vapor deposition mask, wherein the apex of the first convex portion is formed to be located farther from the surface of the substrate than the apex of the second convex portion, the first vapor deposition mask is disposed on the substrate by using the second convex portion as a spacer, and the second vapor deposition mask is disposed on the substrate by using the first convex portion as the spacer.

4. The method according to claim 3, wherein the first vapor deposition mask further has a shielding portion in a region of the substrate facing the second pixel electrode, and the second vapor deposition mask further has a shielding portion in a region of the substrate facing the first pixel electrode.

5. The method according to claim 3, wherein the second organic layer is formed after the first organic layer.

* * * * *